United States Patent [19]

Lee et al.

[11] Patent Number: 5,777,523
[45] Date of Patent: Jul. 7, 1998

[54] POWER-SAVING IC-TYPE OSCILLATION CIRCUIT

[75] Inventors: Chao-kuo Lee, Yunlin Hsien; Chu-Liung Hseih, Taichung, both of Taiwan

[73] Assignee: Holtek Micro Electronics, Inc., Hsin chu

[21] Appl. No.: 729,246

[22] Filed: Oct. 10, 1996

[51] Int. Cl.$^6$ .............. H03B 5/36; H03K 3/012; H03K 5/12

[52] U.S. Cl. .............. 331/74; 331/116 FE; 331/158; 327/166

[58] Field of Search .............. 331/57, 74, 116 K, 331/116 FE, 158; 327/544, 165, 166

[56] References Cited

U.S. PATENT DOCUMENTS

| | | | |
|---|---|---|---|
| 5,355,299 | 10/1994 | Murooka | 331/158 |
| 5,455,542 | 10/1995 | Spence et al. | 331/158 |
| 5,491,441 | 2/1996 | Goetschel et al. | 331/158 X |
| 5,491,456 | 2/1996 | Kay et al. | 331/57 |

FOREIGN PATENT DOCUMENTS

| | | | |
|---|---|---|---|
| 002804490 A1 | 8/1979 | Germany | 327/166 |

Primary Examiner—David Mis
Attorney, Agent, or Firm—W. Wayne Liauh

[57] ABSTRACT

A power-saving IC-type oscillation circuit is disclosed. It contains (a) a quartz oscillator circuit which contains an inverter and a feedback circuit; and (b) an output modulation circuit connected to an output terminal of the quartz oscillator circuit. The output modulation circuit is structured such that, after a sinusoidal wave is received from the output terminal, it will judge the level of the sinusoidal wave in a manner that when the level is high, a high state signal will be sent out to a CMOS transistor, and, when the level is low, a low state signal will be sent out. The output modulation circuit allows the CMOS transistor, which is to be driven by the oscillation circuit, to quickly move out of the power-consuming condition to thus reduce electrical current consumption.

6 Claims, 3 Drawing Sheets

POWER-SAVING IC-TYPE OSCILLATION CIRCUIT

BACKGROUND OF THE INVENTION

1. Field of the Invention

This invention relates to a power-saving IC-type oscillation circuit, and particularly to an oscillation circuit which includes an output modulation circuit and an IC circuit for saving power.

2. Prior Art

Generally, a quartz oscillator contains a natural quartz. Different quartz has different central oscillation frequency. A quartz oscillator is typically connected to a phase-inverting amplifier for signal amplification. The quartz oscillator also includes a capacitor and a feedback circuit to provide a charge-and-discharge function so as to generate a sinusoidal wave at the central oscillation frequency of the quartz. In a conventional oscillator, the power consumption is generally overlooked. In the current IC development, how to develop IC's with low voltage and low power consumption has become an important subject.

In a conventional oscillator, the output signals therefrom have a wave form that is similar to a sinusoidal wave. When such a sinusoidal wave is used for driving an output circuit, the transistor driven by the sinusoidal wave will remain in conducting condition (i.e., conducting state) for an extended period of time. This causes more power to be consumed than needed. Currently, there are some circuits designed to reduce the power consumption by lowering the oscillation frequency. However, such a design will interfere some of the functions designed for the circuit function. It also increases the complication when designing the circuit.

SUMMARY OF THE INVENTION

The prime object of the present invention is to provide a power-saving IC-type oscillation circuit, which allows the transistor in the output stage to quickly move out of the power-consuming condition so as to save power. In the power-saving IC-type oscillation circuit disclosed in the present invention, an output modulation circuit is used to cause the CMOS in the output stage to be quickly moved out of the power-consuming condition so as to save more power.

Another object of the present invention is to provide a power-saving oscillation circuit without lowering the oscillation frequency. The novel oscillation circuit disclosed in the present invention is also highly compatible to the IC circuit structures that are currently used in the industry.

Still another object of the present invention is to provide a power-saving oscillation circuit, which includes a inverter, a pair of capacitors, a feedback circuit, an output modulation circuit, and an external quartz oscillator. By means of the output modulation circuit, the output stage transistors in the oscillation circuit can quickly move out of the transferring condition, i.e., the power-consuming condition, during the working period. The capacitors may be built in the IC, or connected from outside the IC circuit.

DETAILED DESCRIPTION

Figure 1:
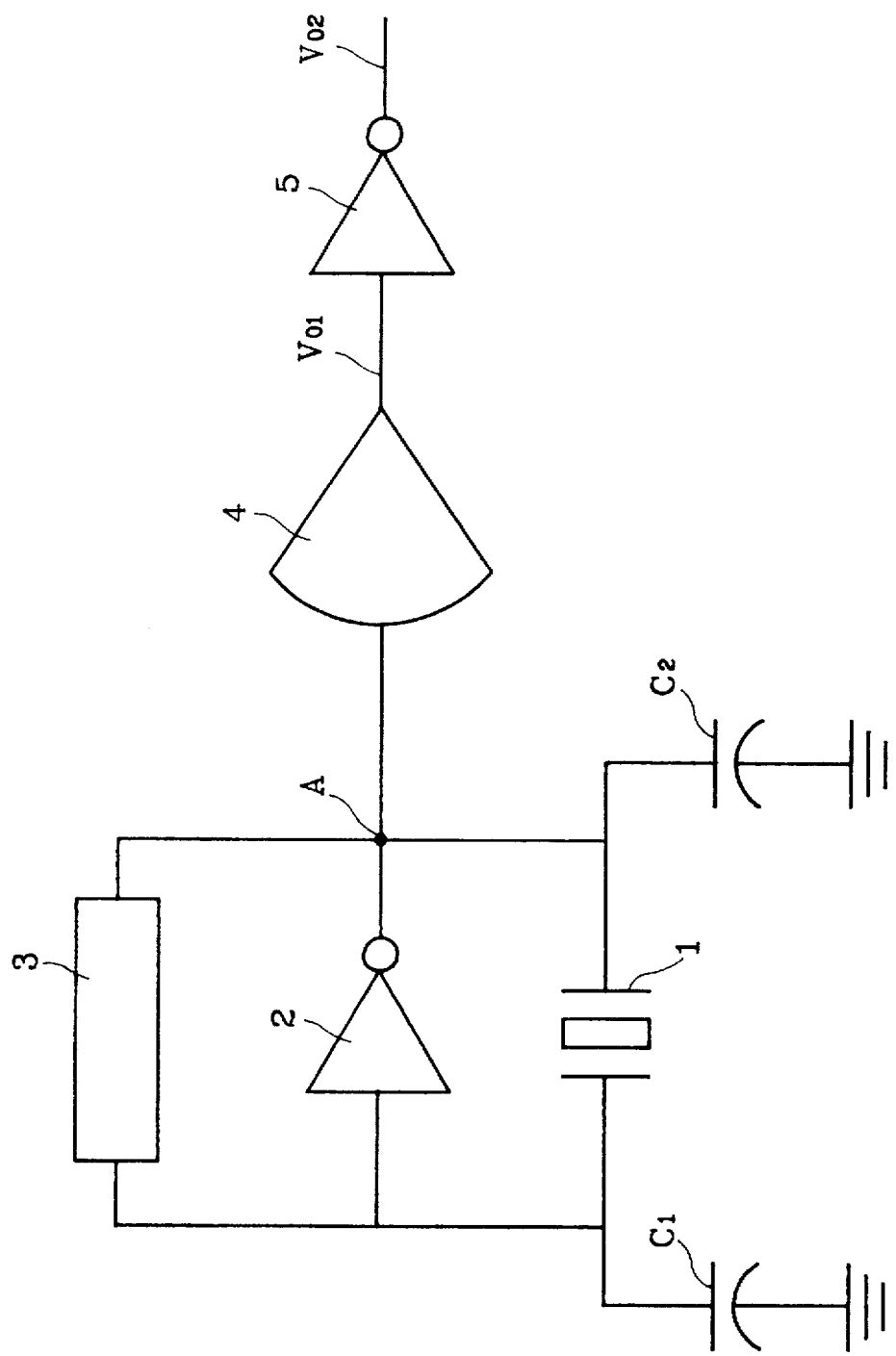
FIG. 1 is a schematic diagram of the present invention.

FIG. 1 is a schematic diagram of the power-saving IC-type quartz oscillator disclosed in the present invention, which comprises a quartz oscillator 1, an inverter 2, a pair of capacitors C1 and C2, a feedback circuit 3, and an output modulation circuit 4. As mentioned above, different quartz oscillators have different central oscillation frequencies. The quartz oscillator is connected to the inverter 2 so as to cause the signal amplified. By means of the capacitors C1 and C2 and the feedback circuit 3, a charging-and-discharging effect will take place to generate a sinusoidal wave having a frequency at the central oscillation frequency of the quartz oscillator.

In FIG. 1, the output wave form at point "A" is similar to a sinusoidal wave, which will become an output wave form $V_{o1}$, which is similar to a square wave after it is modulated through the output modulation circuit 4. The square wave after the output modulation circuit 4 may be directly used as the output of the oscillator directly.

Figure 2:
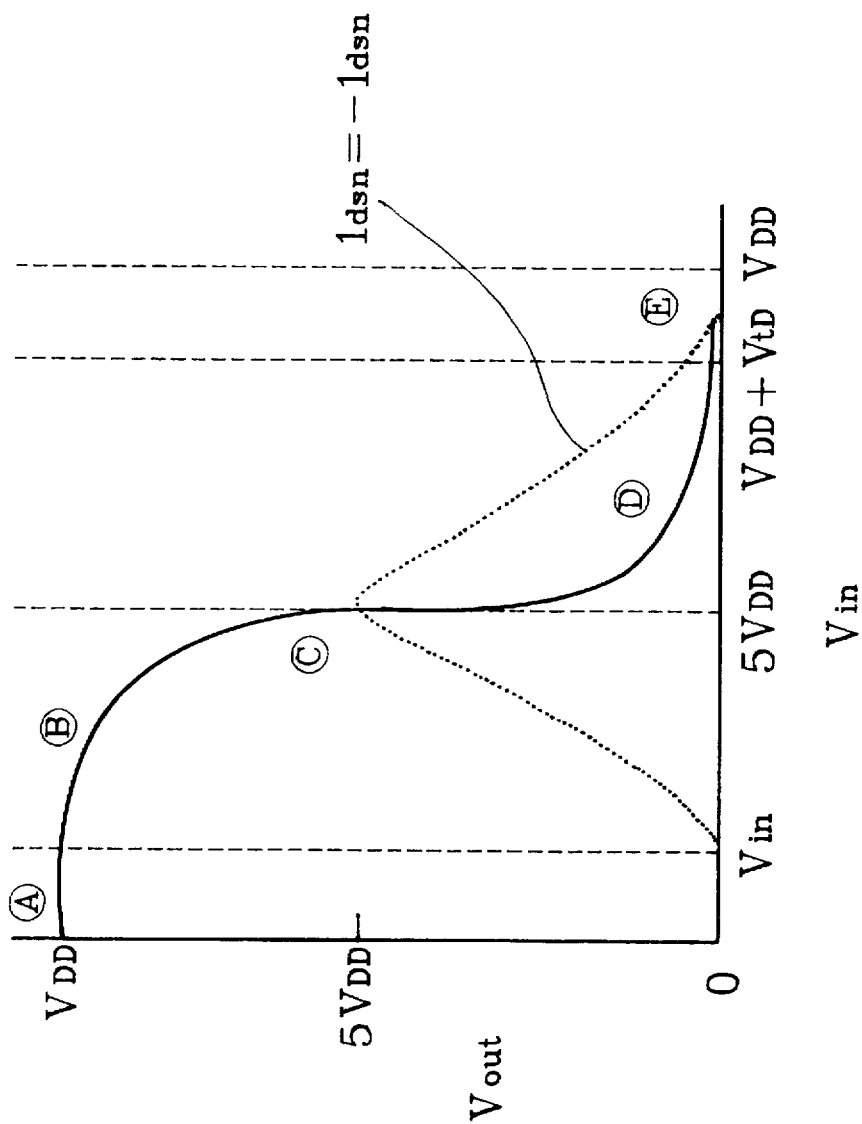
FIG. 2 illustrates the characteristic curve diagram of the output stage of a standard CMOS transistor in the present invention.

FIG. 2 illustrates the characteristic curve diagram of the output stage of a standard CMOS transistor. The abscissa indicates the input voltage $V_{in}$, whereas the ordinate indicates the output voltage $V_{out}$. The characteristic curve as shown in FIG. 2 is divided into five sections: A, B, C, D and E. Section A is a section which indicates that the P-type MOS in the CMOS transistor is in a conducting state, while the N-type MOS is turned off. Sections B, C and D are sections which indicate that both the P-type MOS and the N-type MOS in the CMOS transistor are in the conducting state. In section E, the P-type MOS in the CMOS transistor is turned off, while the N-type MOS is in a conducting state. In sections B, C, and D, each of these sections will have current consumption (as shown by the dotted line). The circuit according to the present invention can reduce the working time in the transferring sections (B, C and D) of the output transistor, so as to reduce the consumption of the electrical current during the output stage of the CMOS transistor.

According to a preferred embodiment of the present invention, the output terminal of the oscillator has an output modulation circuit 4 to enable the CMOS transistor in the output stage of the oscillator to move out of the transferring section (i.e., the power-consuming section in the output curve as shown in FIG. 2) during the working period of the transistor so as to reduce current consumption.

The output of the modulation circuit according to the present invention has a wave form similar to a square wave. After the output passes through the output inverter 5, an improved square wave can be further obtained. Thus, according to this preferred embodiment of the present invention, an output inverter 5 is provided at the output stage of the oscillator. After the output of the output modulation circuit 4 passes through the output inverter 5, the output wave form $V_{o2}$ will be more close to a square wave.

Figure 3:
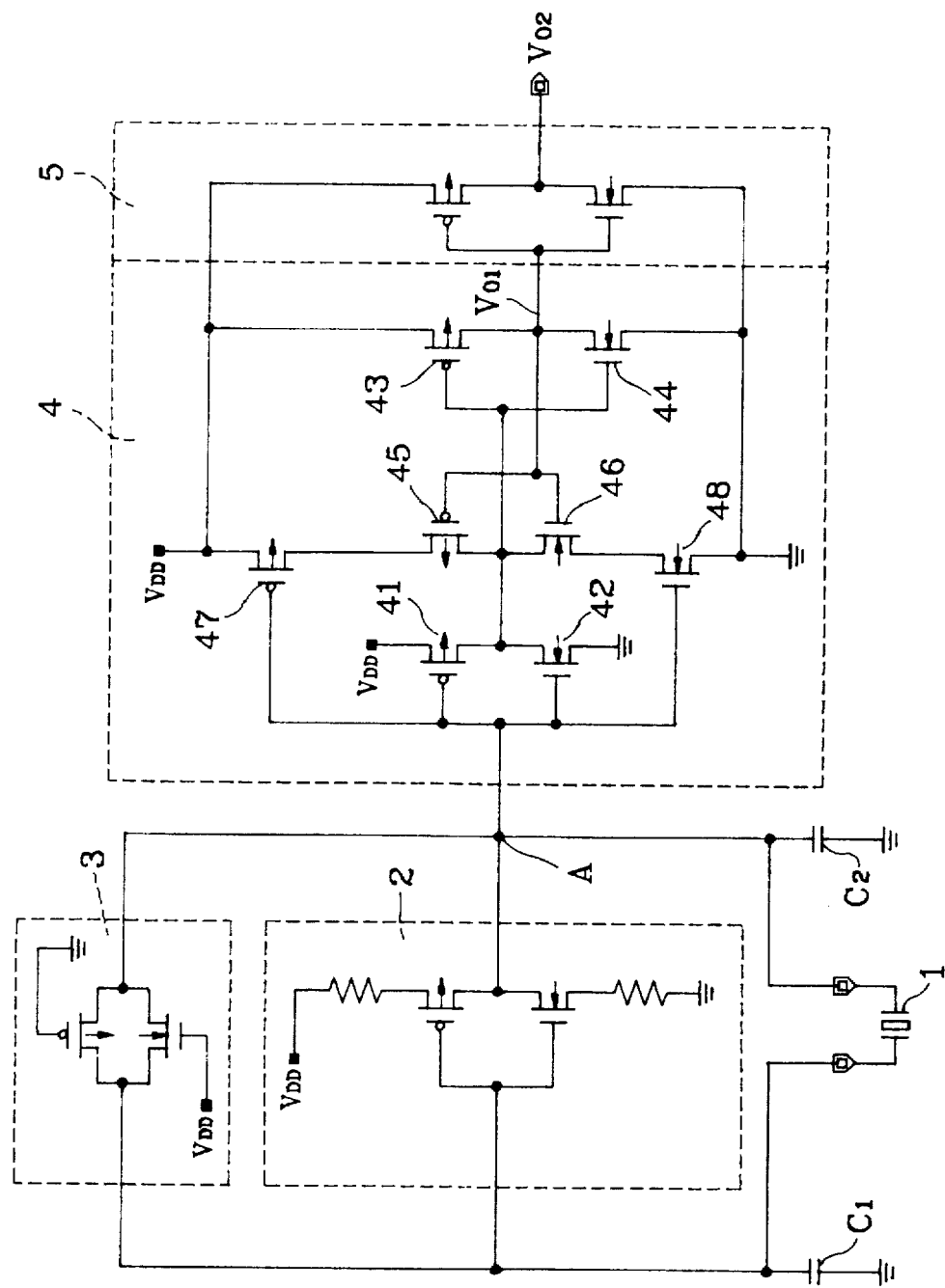
FIG. 3 illustrates a preferred embodiment of circuit diagram according to the present invention.

FIG. 3 shows a circuit diagram according to a preferred embodiment of the present invention, in which the output modulation circuit 4 includes a plurality of CMOS transistors. The interconnections of these CMOS gates are also clearly described in FIG. 3. Of course, such circuit 4 can also be made of an equivalent switching circuit to provide the same output modulation function. The output inverter 5 is formed with a P-type MOS and a N-type MOS.

FIG. 3 shows that the output modulation circuit 4 comprises four CMOS inverters which are connected in an interlocking relationship. Each of the CMOS inverters consists of an n-channel MOSFET (42, 44, 46, or 48), and a p-channel MOSFET (41, 43, 45, or 47). The sinusoidal wave A is first sent to both the first CMOS inverter (41, 42), and the fourth CMOS inverter (47, 48). The output from the first CMOS inverter is then fed to output of the the third CMOS inverter (45, 46) and to the input of the second CMOS inverter (43, 44) The n-channel MOSFET 46 and the p-channel MOSFET 45 of the third CMOS inverter are not connected to the $V_{DD}$ and ground, respectively. Rather, they are separated by the n-channel MOSFET 48 and the p-channel MOSFET 47 of the fourth CMOS inverter, respectively. The input of the third CMOS inverter is connected to the output from the second CMOS converter, and the second inverter output is input to the output inverter 5.

As mentioned above, the output wave form at point A of the oscillator is a wave similar to a sinusoidal wave. When such a sinusoidal wave is sent into the output modulation circuit 4, the circuit will judge the level thereof. When the level is higher than a reference level, a "high state" will be sent out. When the level is lower than a reference level, a "low state" will be sent out. The output modulation circuit can provide a magnetic hysteresis effect, and therefore it has a capability of adjusting the form of an output wave so as to enable the related transistors to move out of the power-consuming sections, i.e., transferring sections. After the sinusoidal wave passes through the output modulation circuit 4, the output wave form $V_{o1}$, will have a wave form similar to that of a square wave. After such wave passes through the output inverter 5, the output wave form Vo2 will be further resembling a square wave.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

We claim:

1. A power-saving IC-type oscillation circuit comprising:

a quartz oscillator circuit which contains an inverter and a feedback circuit;

an output modulation circuit connected to an output terminal of said quartz oscillator circuit;

wherein said output modulation circuit is structured such that after a sinusoidal wave is received from said output terminal, said output modulation circuit will judge the level of said sinusoidal wave in a manner that when said level is high, a high state signal will be sent out, and when said level is low, a low state signal will be sent out so as to enable a CMOS transistor, which is connected to and is to be driven by said oscillation circuit to quickly move out of a power-consuming condition to thus reduce electrical current consumption.

2. A power-saving IC-type oscillation circuit as claimed in claim 1, wherein said output modulation circuit converts said sinusoidal wave into a first square wave, which can be used as an output of said oscillation circuit.

3. A power-saving IC-type oscillation circuit as claimed in claim 2 which further includes an output inverter connected to an output terminal of said output modulation circuit, said output inverter further converts said first square into a second square, which more closely resembles to a true square wave.

4. A power-saving IC-type oscillation circuit as claimed in claim 1 which is connected with a quartz resonator.

5. A power-saving IC-type oscillation circuit as claimed in claim 1, wherein said oscillation circuit is externally connected to at least a capacitor.

6. A power-saving and IC type of oscillation circuit as claimed in claim 1, wherein said oscillation circuit includes a capacitor which is provided internally and is connected to said inverter.

\* \* \* \* \*